United States Patent [19]

Andrews

[11] Patent Number: 4,495,586
[45] Date of Patent: Jan. 22, 1985

[54] WAVEFORM ACQUISITION APPARATUS AND METHOD

[75] Inventor: Roland E. Andrews, Portland, Oreg.

[73] Assignee: Tektronix, Inc., Beaverton, Oreg.

[21] Appl. No.: 402,872

[22] Filed: Jul. 29, 1982

[51] Int. Cl.³ ............................................. H02K 13/02
[52] U.S. Cl. ..................................... 364/487; 315/367
[58] Field of Search ........................ 364/487, 480, 481; 324/121 R, 77 R; 315/367, 370

[56] References Cited

U.S. PATENT DOCUMENTS

| | | | |
|---|---|---|---|
| 4,053,831 | 10/1977 | Furukawa et al. | 324/121 R X |
| 4,068,310 | 1/1978 | Friauf | 324/121 R X |
| 4,072,851 | 2/1978 | Rose | 364/487 |
| 4,100,532 | 7/1978 | Farnbach | 364/481 X |
| 4,142,146 | 2/1979 | Schumann et al. | 364/487 X |
| 4,225,940 | 9/1980 | Moriyasu et al. | 315/367 X |
| 4,251,814 | 2/1981 | Dagostino | 315/367 X |
| 4,283,713 | 8/1981 | Philipp | 315/367 X |
| 4,335,442 | 6/1982 | Backe | 364/487 X |
| 4,346,333 | 8/1982 | Dagostino | 315/367 |
| 4,399,512 | 8/1983 | Soma et al. | 364/487 |

*Primary Examiner*—Edward J. Wise
*Attorney, Agent, or Firm*—George T. Noe

[57] ABSTRACT

A waveform acquisition apparatus and method permits a plurality of samples of an input signal to be taken for each trigger recognition event, and stored at predetermined memory addresses to provide a complete equivalent-time waveform in which all accumulated samples are in correct time relation to each other. The mathematical determination of each address is obtained by measuring the time difference between a trigger recognition event on each cycle of a repetitive signal and a next occurring sample clock following each trigger recognition event, and then using a microprocessor to compute the relative addresses.

2 Claims, 3 Drawing Figures

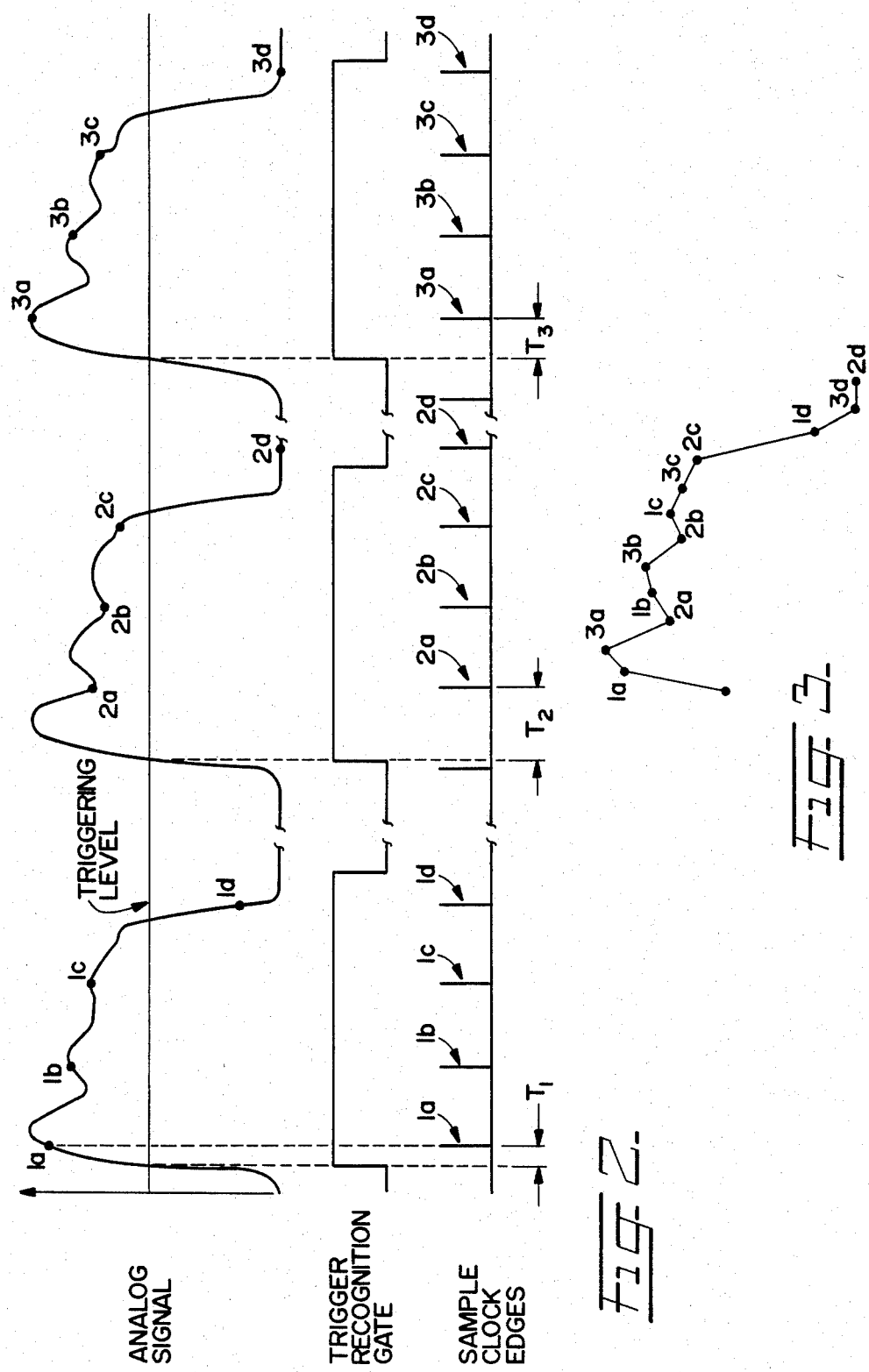

WAVEFORM ACQUISITION APPARATUS AND METHOD

BACKGROUND OF THE INVENTION

Digital oscilloscopes acquire electrical signals by quantizing samples taken at spaced time intervals and then storing such quantized samples in a memory for subsequent display as reconstructed waveforms. Until recently, digital oscilloscopes have been severely limited in apparent bandwidth because all of the samples comprising a waveform has to be taken sequentially at the sample clock rate in a single cycle of the signal due to the asynchronous relationship of the trigger event and the sample clock. This mode of operation is known in the digital oscilloscope art as single-shot acquisition.

The apparent bandwidth of signal acquisition has been extended significantly in an acquisition mode similar to equivalent-time random sampling—that is, sampling points on respective cycles of a recurring signal and reconstructing therefrom a single equivalent-time cycle of signal even though the waveform samples may have been acquired many cycles apart. A problem associated with such equivalent-time waveform reconstruction is that it takes a comparatively long time to acquire all of the relevent samples which represent the respective data points.

Another problem is that the triggering point, which is the same on each successive cycle of the signal, and the sample clock, which operates at a predetermined fixed rate, are not correlated, resulting in horizontal jitter of the displayed data points with respect to each other. This problem was addressed by U.S. Pat. No. 4,251,754 to Luis J. Navarro and Thomas P. Dagastino, which teaches jitter correction due to sample uncertainty by measuring the time interval between a trigger recognition event (produced when the signal potential passes through a selectable threshold level) and the next succeeding sample clock pulse, and then utilizing the measured value to generate an offset current in the display horizontal system which causes a horizontal shifting of each frame of the dispay thereby to place each displayed sample at its correct time position. However, this solution to the jitter problem does not lend itself well to intermediate waveform processing by a computer or the like because the correction takes place in the display system.

Another aspect of equivalent-time waveform reconstruction is the effect of the lower Nyquist limit on the sampling rate for periodic sampling. That is, if the sampling rate is less than twice the frequency of the input signal, information will be lost due to under sampling, eventually resulting in a distorted displayed waveform. Thus, it would be desirable to acquire multiple samples for each trigger signal recognition, and to provide the correct equivalent-time location for each sampled data point in the acquisition process.

SUMMARY OF THE INVENTION

In accordance with the present invention, a waveform acquisition apparatus and method permits a plurality of samples of an input electrical signal to be taken for each trigger recognition event, and stored at predetermined memory addresses rather than to have to horizontally shift the display. The time is measured between a trigger recognition event and the first sample clock pulse for each of a plurality of samples, and then the correct equivalent-time address for each sample is arithmetically determined. The samples are digitized and stored in a waveform memory at the address computed. The process is repeated for each block of multiple samples until the waveform memory contains the entire waveform at the computed addresses. A feature of the invention is the use of fast memory of N samples, such as is afforded by a chargecoupled device (CCD), so that a pretrigger selection capability may be provided for single-event signals as well as equivalent-time waveforms acquired over many cycles of a repetitive input signals.

It is therefore one object of the present invention to provide a novel waveform acquisition apparatus and method in which equivalent-time waveforms may be reconstructed with a substantial reduction in jitter.

It is another object to provide a waveform acquisition apparatus and method which eliminates jitter by measuring the time difference between the trigger recognition event and the next succeeding sample clock pulse and computing correct equivalent-time addresses for each block of samples taken.

It is a further object to provide an apparatus and method which enables rapid acquisition of repetitive signals to and beyond the single-event Nyquist frequency and yet retain the same pretrigger selection capability as for single-event signals.

It is an additional object to provide a waveform acquisition apparatus and method which is capable of acquiring a complete equivalent-time waveform rapidly through the use of a high-speed analog memory which permits keeping all relevant samples acquired at the high sampling rate.

Other objects and attainments of the present invention will become apparent to those skilled in the art upon a reading of the following detailed description when taken in conjunction with the drawings.

DRAWINGS

FIG. 2 is a waveform diagram showing the time interval measurement for each block of acquired samples to permit the correct equivalent-time addresses to be computed; and FIG. 3 shows a reconstructed equivalent-time waveform.

DETAILED DESCRIPTION OF THE INVENTION

Figure 1:
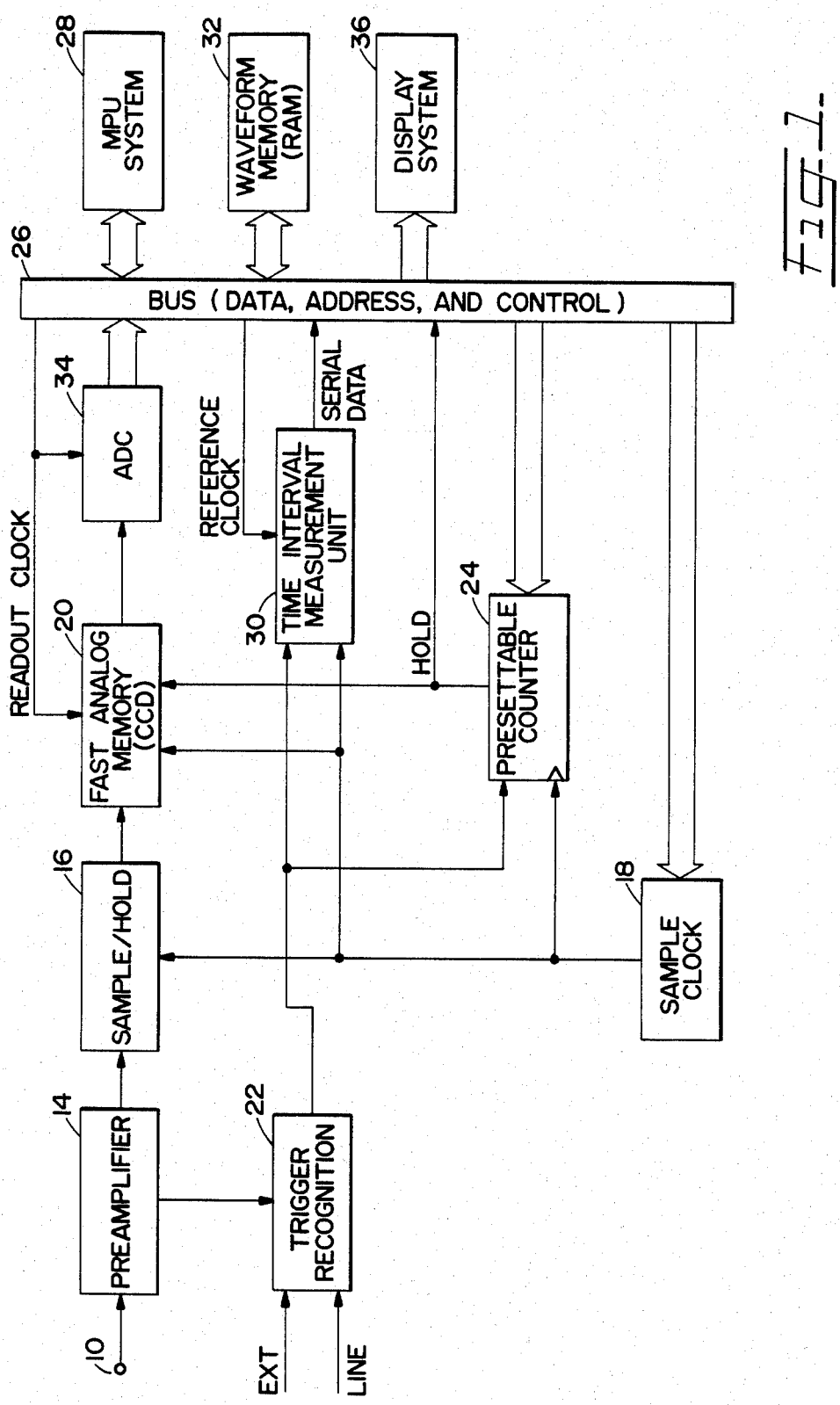
FIG. 1 is a block diagram of a waveform acquisition apparatus in accordance with the present invention.

Referring to the block diagram of FIG. 1, an analog signal is applied via an input terminal 10 to a preamplifier 14, which may suitably be a conventional gain switching amplifier for amplifying or attenuating the input signal to a suitable level. The preamplified analog signal is then applied to a sample-and-hold circuit 16, which takes samples of instantaneous valves of the analog signal at evenly spaced intervals determined by a sample clock 18. In a proposed commercial embodiment, the sample clock produces sample clock pulses at a selectable rate between 200 kilohertz and 20 megahertz, to accommodate a wide range of analog signal frequencies. The instantaneous valves of the analog signal are applied to a fast analog memory 20, which may suitably be a charge-coupled device (CCD), permitting rapid acquisition of a sequence of several signal samples.

The analog signal is applied from preamplifier 14 to a trigger recognition circuit 22, which generates a recognition gate signal at a point on the analog signal determined by an internal level control in the conventional oscilloscope triggering manner. Additionally, a recognition gate may be produced by the trigger recognition circuit 22 in response to an externally applied triggering signal (EXT) or a 60-hertz power line (LINE) signal applied thereto in the conventional oscilloscope triggering manner. The recognition gate signal is applied to the enable input of a presettable counter 24, which may be preset to provide pre-triggered or post-triggered operation in a conventional manner. Sample clock pulses are applied to the clock input of the presettable counter 24 as well. When the terminal count is reached, a hold signal is applied to the fast analog memory 20 to hold whatever samples are stored therein. The hold signal from presettable counter 24 is also applied via a bus 26 to a microprocessor (MPU) system 28 to provide notification to such MPU, which controls the entire apparatus, that a series of samples are stored in the fast analog memory 20. It should be pointed out that the MPU system 28 also provides preset information to the presettable counter 24 and provides sampling rate information to a sample clock 18. The actual values may be selected by the user of the apparatus by means of front-panel controls or a keyboard (not shown).

The recognition gate produces by trigger recognition circuit 22 is also applied to a time interval measurement unit 30, which measures the time interval between the recognition event and a next succeeding sample clock pulse applied thereto from the sample clock 18. A high-speed reference clock, for example, 40 Megahertz, is applied to the time interval measurement unit 30 from MPU system 28 to facilitate the interval measurement. The measured value is applied in the form of serial data via the bus 26 to the MPU system 28. As is conventional, the MPU system 28 may suitably include an arithmetic logic unit for performing arithmetic operations, a random-access memory (RAM) for temporary storage of information, and a read-only memory (ROM) containing various processor instructions. The MPU system 28 computes, from the time interval measurement information, correct addresses for waveform memory 32 to store the samples contained in fast analog memory 20.

After MPU system 28 receives the hold signal from presettable counter 24, and the serial data from time interval measurement unit 30, a read-out clock signal is applied to fast analog memory 20 and an analog-to-digital converter (ADC) 34 to read out the stored sampled and convert them to digital data words which are applied over the bus 26 (in the example) to the waveform memory 32 to be stored in the computed addresses. Thereafter, another series of samples may be taken and stored in the fast analog memory 20, a new time interval measured by time interval measurement 30, new addresses computed and the new samples converted to digital form and stored in waveform memory at the computed correct addresses. The process is repeated until the waveform memory 32 contains a complete equivalent-time waveform in which each sample is stored at its computed correct address location. The stored waveform may thereafter be read out of waveform memory 32 and displayed by a display system 36 or processed in some other manner. Display system 36 may suitably contain conventional digital-to-analog coverters, amplifiers, and a cathode-ray tube for displaying a reconstructed waveform.

FIG. 2 shows a very simplified example of the acquisition of a repetitive input signal, and FIG. 3 shows the reconstructed equivalent-time waveform. For this example, let us assume that just four samples are going to be taken on each cycle of signal, and that the presettable counter 24 is set to count samples taken following trigger recognition. As explained previously, as soon as the analog signal passes through a selected triggering level, a trigger recognition gate is generated. On the first cycle of the analog signal, sample clock pulses 1a, 1b, 1c, and 1d result in corresponding samples taken at those time points. The time interval measurement unit 30 measures a time $T_1$ between the rising edge of the trigger recognition gate and the next succeeding sample clock pulse, which is 1a as shown. The MPU system 28 receives a serial digital data input indicative of the time interval $T_1$ and computes therefrom four addresses to store the four samples taken. Since the sample interval is constant, it is not necessary to go through the computation proceess for each address. It can be appreciated that this would be a rather time consuming process if, for example, 32 samples (or more) were taken on each cycle of the analog signal. On the second cycle of the analog signal, samples 2a, 2b, 2c, and 2d are taken, and the time interval $T_2$ between the trigger recognition gate and the next succeeding clock pulse 2a is measured. The time interval $T_2$ is utilized to compute the addresses for these four samples. The process is repeated for the third cycle of the analog signal, with the time interval $T_3$ being measured and new memory addresses computed. This system allows the waveform samples to be stored at the correct addresses of the waveform memory so that, if desired, the waveform may be read out of memory for further processing or transmission to some other device. FIG. 3 shows the reconstructed waveform, with each sample identified as it corresponds to the samples taken as shown in FIG. 2. Of course, in an actual waveform acquisition and reconstruction situation, many samples would be taken so that the dot density would be increased, more closely replicating the input signal.

The time interval measurement unit 30 may suitably be any of a number of conventional time interval meters for measuring elasped time between two events. One such example is that disclosed in U.S. Pat. No. 4,301,360 to Bruce W. Blair. Here, a counter is enabled during the time between the two events, and a high speed clock signal is counted. In the present invention, an eight-bit parallel counter is utilized for this purpose, and a parallel-to-serial converter is employed to provide eight-bit serial time interval measurement data to the MPU system 28.

It will therefore be appreciated that the aforementioned and other desirable objects have been achieved; however, it should be noted that the embodiment shown and described herein is intended as merely illustrative and not as restrictive of the invention, and many changes and modifications thereof may occur to those skilled in the art.

What I claim as being novel is:

1. A method of acquiring an equivalent-time waveform over a plurality of cycles of a repetitive input signal, comprising the steps of:

taking one or more samples at equally spaced intervals of a sample clock along each cycle of said plurality of cycles;

measuring the time difference between a fixed point on said each cycle and a next occuring sample clock;

computing from said measured time difference an address of a memory for each of said samples, wherein said computed addresses are at equally-spaced intervals with respect to each other for each cycle, but shifted a number of addresses proportional to said time difference; and storing said samples in said memory at said computed addresses.

2. An apparatus for acquiring an equivalent-time waveform over a plurality of cycles of a repetitive signal, comprising:

means for taking one or more samples at equally spaced intervals of a sample clock along each cycle of said plurality of cycles;

means for measuring the time difference between a fixed point on said cycle and a next occurring sample clock;

means for computing from said measured time difference an address of a memory for each of said samples, wherein said computed addresses are at equally-spaced intervals with respect to each other for each cycle, but shifted a number of addresses proportional to said time difference; and means for storing said samples in said memory at said computed addresses.

* * * * *

UNITED STATES PATENT AND TRADEMARK OFFICE
CERTIFICATE OF CORRECTION

PATENT NO. : 4,495,586
DATED : January 22, 1985
INVENTOR(S) : Roland E. Andrews

It is certified that error appears in the above—identified patent and that said Letters Patent is hereby corrected as shown below:

Column 1, line 12, reads "has" should be --had--.

Column 1, line 34, reads "Dagastino" should be --Dagostino--.

Column 1, line 42, reads "dispay" should be --display--.

Column 2, line 58, reads "valves" should be --values--.

Column 2, line 64, reads "valves" should be --values--.

Column 3, line 29, reads "produces" should be --produced--.

Column 3, line 52, reads "sampled" should be --samples--.

Column 3, line 54, reads "the example" should be --this example--.

Column 4, line 22, reads "proceess" should be --process--.

Column 4, line 46, reads "elasped" should be --elapsed--.

Signed and Sealed this

Eighth Day of October 1985

[SEAL]

Attest:

DONALD J. QUIGG

Attesting Officer

Commissioner of Patents and Trademarks—Designate